United States Patent
de Maagt et al.

(10) Patent No.: US 6,469,682 B1
(45) Date of Patent: Oct. 22, 2002

(54) PERIODIC DIELECTRIC STRUCTURE OF THE THREE-DIMENSIONAL PHOTONIC BAND GAP TYPE AND METHOD FOR ITS MANUFACTURE

(75) Inventors: Peter de Maagt, Leiden (NL); Ramon Gonzalo, Logrono-La Rioja (ES); Gerald Crone, En Lisse (NL)

(73) Assignee: Agence Spatiale Europeenne, Paris (FR)

( * ) Notice: Subject to any disclaimer, the term of this patent is extended or adjusted under 35 U.S.C. 154(b) by 0 days.

(21) Appl. No.: 09/568,040

(22) Filed: May 10, 2000

(30) Foreign Application Priority Data

May 11, 1999 (FR) ............................................ 99 06013

(51) Int. Cl.[7] .............................................. H01Q 15/02
(52) U.S. Cl. .................................. 343/909; 343/911 R
(58) Field of Search ................................ 343/909, 910, 343/911 R, 912, 753

(56) References Cited

U.S. PATENT DOCUMENTS

| | | | |
|---|---|---|---|
| 5,172,267 A | 12/1992 | Yablonovitch | 359/515 |
| 5,389,943 A | * 2/1995 | Brommer et al. | 343/909 |
| 5,406,573 A | 4/1995 | Ozbay et al. | 372/43 |
| 5,600,483 A | 2/1997 | Fan et al. | 359/344 |
| 5,684,817 A | 11/1997 | Houdre et al. | 372/45 |
| 5,689,275 A | * 11/1997 | Moore et al. | 343/786 |
| 5,990,850 A | * 11/1999 | Brown et al. | 343/912 |

FOREIGN PATENT DOCUMENTS

| | | | | |
|---|---|---|---|---|
| EP | 0 742 620 | 11/1996 | | |
| WO | WO 98/25314 | 6/1998 | ........... | H01L/33/00 |
| WO | WO 98/44368 | 10/1998 | ............ | G02B/6/12 |

OTHER PUBLICATIONS

K. Agi, et al., Ultra–Wideband, Short–Pulse Electromagnetics 2, pp. 341–350, "An Ultra–Wideband Photonic Crystal", 1995.

O. Hanaizumi, et al., Applied Physics Letters, vol. 74, No. 6, pp. 777–779, "Propagation of Light Beams Along Line Defects Formed In a–Si / SiO$_2$ Three–Dimensional Photonic Crystals: Fabrication and Observation", Feb. 8, 1999.

* cited by examiner

Primary Examiner—Don Wong
Assistant Examiner—Hoang Nguyen
(74) Attorney, Agent, or Firm—Oblon, Spivak, McClelland, Maier & Neustadt, P.C.

(57) ABSTRACT

The present invention relates to a crystal structure with three-dimensional photonic band gap which comprises a pile of alternate series of layers of distinct dielectric materials having a first and a second determined dielectric constant values, wherein said layers have a constant determined thickness and said pile forms a substantially rectangular parallelepipedal block, and a plurality of parallel channels provided through said block along a direction orthogonal to the main faces of said layers. Said channels are distributed according a two-dimensional lattice pattern and have a third determined dielectric constant value. The values for the dielectric constants as well as the relative geometric dimensions of said layers and said channels are selected so as to obtain said three-dimensional photonic band gap in a predetermined frequency range. The crystal structure is especially for use as an antenna substrate.

12 Claims, 3 Drawing Sheets

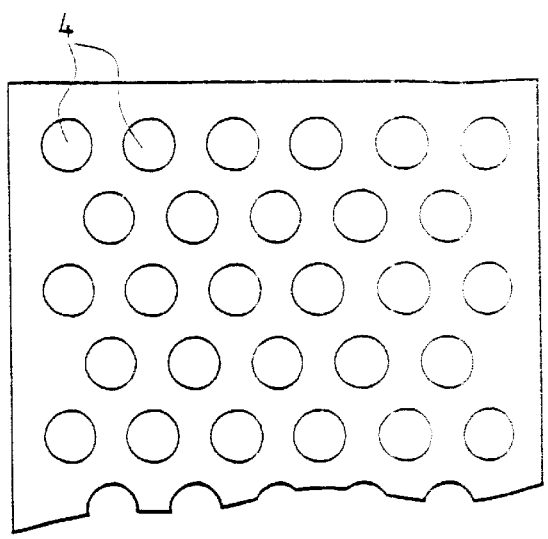
FIG.3A
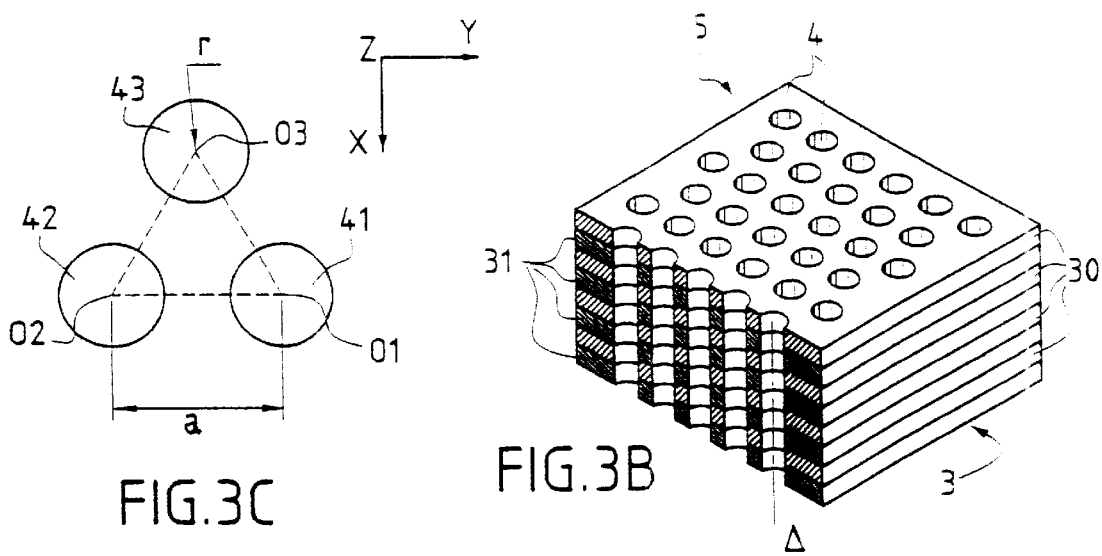
FIG.3C
FIG.3B
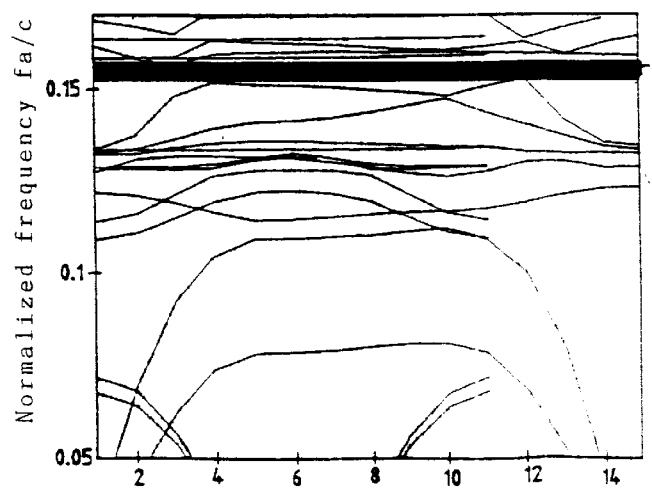
FIG.4

PERIODIC DIELECTRIC STRUCTURE OF THE THREE-DIMENSIONAL PHOTONIC BAND GAP TYPE AND METHOD FOR ITS MANUFACTURE

BACKGROUND OF THE INVENTION

Field of the Invention

The invention relates to a crystalline structure with three-dimensional photonic band gap. It also relates to a manufacturing method for said structure.

Recent discoveries have allowed emphasizing a particular physical phenomenon, which develops within periodic dielectric structures, such as some crystals., wherein differences of electrical properties are periodically repeated through their thickness. This phenomenon has been called "photonic band gap", or "PBG" (by analogy with the electronic band gap which can be created in semiconductor crystals). Structures with a photonic band of this type will hereinafter be referred to as "photonic crystals".

Exemplary, non-exhaustive structures of this type were described in the following article or book;
- the book "Photonic Crystals, Molding the Flow of Light", J. D. JOANNOPOULOS and al. "Princeton University Press", 1995; and
- the article: "Photonic Band gap materials", in "Proceedings of the NATO Advanced Institute-on Photonic Band gap Materials", ELOUNDA, Greece, June 1995.

Although one-dimension photonic crystals have been used for long, the idea of creating two- or three-dimension photonic band gap structures only appeared some ten years ago. Ever since, and due to the considerable possibilities, they offer, the interest for photonic crystals has been growing. Indeed, photonic crystals are appropriate for a large number of applications and they are actually in use in devices such as semiconductor lasers, solar cells, high quality resonant cavities, and filters.

Due to their remarkable features, the photonic crystals have found an application more recently in hyper frequency circuits or in components operating in the millimeter or sub-millimeter wave ranges. More particularly, such crystals have found an advantageous application in the so-called photonic band gap antennas, where they are used as substrates for antenna systems.

In an antenna of this type, the underlying photonic crystal prevents that electromagnetic waves of the considered frequency that reach it to propagate therein, and thus it reflects towards the surrounding air the entire electromagnetic radiation emanating from the system it supports, inasmuch as the antenna working frequency matches the band gap frequency.

It is thus effectively possible to consider the photonic crystals as being the electromagnetic homologues of the semiconductor crystals, so far as their behavior towards the electrons is concerned. The photonic crystals have a frequency band for which the propagation of electromagnetic wave through them is inhibited. The operating parameters of the photonic band gap structures are to be found in the periodicity of the variation of their dielectric properties, in the dielectric contrast and in the achieved structural arrangement.

The photonic crystals offer very substantial opportunities for the future, since they allow reducing the global mass of the system where they are used and improve the radiation efficiency performances that are essential for systems operating in a radio frequency or optical frequency range of a predetermined extent.

Those photonic band gap crystals the structure of which is only two-dimensional offer the substantial advantage of being easy to produce. But, although they can be useful sometimes, it appears that the three-dimensional photonic band gap crystal structures prove more appropriate for uses such as antenna substrates. Basically, an aitenna radiates in a three-dimensional space. It follows therefrom that it is preferable to provide a structure ensuring a completely three-dimensional photonic band gap, that will be able to prevent any propagation of the electromagnetic radiation through it by covering all spatial directions, and that will consequently be effective as an omni-directional reflector, A few three-dimensional configurations have been proposed in the prior art. Typical exemplary structures will be indicated below, and their main features will briefly be reminded, in connection with the manufacturing method.

U.S. Pat. 5,172,267 "Optical reflector structure, method of fabrication, and communication method", (filed by Eli YABLONOVITCH) describes a first type of photonic crystals with a three-dimensional band gap.

The appended FIG. 1A illustrates both the main features of the crystal structure la and the manufacturing process thereof. A mask 2, with a lattice of holes 2$a$ regularly distributed in a triangular mesh configuration, is arranged on a crystal block 10$a$, simply. shaped as a rectangular parallelepipedal bar. Three successive micromachining operations are conducted, each of which provides straight holes or channels 100$a$ in the crystal along a different determined orientation.

These micro-machining operations, for instance, can be performed by resorting to mechanical drilling, microlithography or ion beam technics, as suggested by the presence of three beams f1–f3 in FIG. 1$a$. More precisely, the three micro-machining operations can be performed along three different respective directions $\Delta 1$ to $\Delta 3$, each tilted by an angle $\alpha$ of predetermined identical amplitude with respect to a vertical axis $\Delta V$, orthogonal to the upper face of mask 2, and also consequently to both main faces of bar 10$a$. The angle $\alpha$ precisely equals 35.26 degrees. All three directions $\Delta 1$ to $\Delta 3$ are equally distributed in space; they consequently form angles of 120 degrees between one another. Those micro-machining operations result in a three-dimensional set of holes 100$a$ providing empty channels in the material and crossing each another within the bar 10$a$.

By appropriately selecting the physical characteristics (dielectric constant of the material forming the original crystal) as well as the geometric features (diameter of the holes in the mask, pitch distance between the adjacent holes), the structure with the desired three-dimensional photoninc band gap is obtained. For a more detailed description concerning the features of this structure according to the prior art, reference can be made to the above mentioned U.S. Pat. No. 5,172,267.

By appropriately selecting the physical characteristics (dielectric constant of the material forming the original crystal) as welle as the geometric features (diameter of the holes in the mask, pitch distance between adjacent holes), the structure with the desired three-dimensional photonic band gap is obtained. For a more detailed description concerning the features of this structure according to the prior art, reference can be made to the above mentioned patent U.S. Pat. No. 5,172,267.

However, it will be easily ascertained that the manufacturing method taught by the above prior art is quite complex, notably because three micro-machining, must be performed along three directions with different slopes with respect to the vertical axis $\Delta V$.

A second type of photonic crystal structures of the three-dimensional photonic band gap type is described in the U.S. Pat. No. 5,406,573 (Ekmel OZBAY and al.). The general configuration of the proposed structure, as described according to several alternatives, resembles a wood stack in which layers of logs, alternately oriented in two perpendicular directions, are piled successively on top of one another.

The appended FIG. 1B, which reproduces the main features of FIG. 2 in the above-mentioned prior art patent, illustrates one of the structure alternatives described in this document, said structure being designated as 1b in FIG. 1B. The 1b structure consists of a pile of rods 1b, arranged in layers on several levels, numbered N1 to N4 in FIG. 1B, and more generally N1 to Nn.

All rods are arranged parallel to an arbitrary reference plane with orthononnative axes X and Y, and rods located within a particular layer at a same level parallel to this plane are parallel to one another. Rods arranged in two if successive levels, for instance N1 and N2, are orthogonal to one another, i.e. they are alternately parallel to one then the other of the two axes x and Y of the universal two-dimension set x-Y, when going from one layer to the next one.

Furthermore, when considering two rows of rods 10b parallel to either one of the axes X or Y, with a being the lattice pitch representing the distance between two adjacent rods in the same layer, those rods belonging to the n-th rank level (for instance N4) will be shifted by half a pitch, i.e. a/2, from the rods belonging to the (n–2)-th rank level (for instance N2). Consequently, rods having the same orientation are staggered from one level to the other, and this is true for both perpendicular orientations. In other words, the piling sequence is identically repeated every fourth layer.

Like in the previous case, the desired structure with a three-dimensional photonic band gap is obtained by appropriately selecting the physical properties (dielectric constant of the material forming the rods) and the geometric properties (rod diameter and pitch a which together determine a filling coefficient, representative of the ratio between the volume occupied by the material and the volume occupied by empty zones remaining between the rods). For a more detailed description of the features of this structure, reference can be made to U.S. Pat. No. 5,406,573 already mentioned.

Manufacturing this structure seems a priori less complex than for the preceeding one, inasmuch as the method consists in successively arranging rod layers on top of one another, similarly to a wood stack. Experience however shows that the thus obtained structure is brittle and has a low efficiency.

A third type of photonic crystal structure is described in the U.S. Pat. No. 5,600,483 (Shanhui FAN et al.). An example of such a structure is illustrated in the appended FIG. 1C, which corresponds in its main features to FIG. 1 of that patent.

The three-dimensional structure 1c is obtained from a basic rectangular parallelepipedic crystal block structure, having its main faces parallel to an arbitrary universal set XYZ. Block 1c consists of a plurality of two-dimension substructures 10c, made of stratums forming layers at different levels, shifted with respect to one another and parallel to the XY plane of the universal set XYZ. The different materials forming such stratums respectively have a first and a second dielectric constants:regions 10c and 101c, respectively. The final three-dimensional structure is obtained by providing channels 102c of a material with a third value for its dielectric constant. Channels 102c are arranged parallel to the Z-axis of the universal set XYZ.

Like in both previous cases, the desired structure with a photonic band gap is obtained by appropriately selecting the physical characteristics (dielectric constant values) and the geometric characteristics (channel diameter, distance between channel axes, relative stratums thicknesses, etc.) of the materials used. For a more detailed description of such structure features, reference can be made to the above U.S. Pat. No. 5,600,483.

This structure however is complex and requires a number of manufacturing steps.

SUMMARY OF THE INVENTION

It is the object of the present invention to remedy to the inconveniences of the prior art methods and devices, some of which were just stated, and more particularly to simplify the manufacturing of photonic crystals operating in all three spatial dimensions, to reduce their costs and to improve their performances, in particular when they are intended for applications in which they act as radiation reflectors and are used as antenna substrates in the production of telecommunication antennas.

The invention relates namely to a periodic dielectric structure of the three-dimensional photonic band gap type, having a simple configuration and combining the easy manufacture process of the one or two-dimension structures and the inherent efficiency of the complete three-dimensional structures.

For this purpose, the three dimensional structure is obtained from a structure with a very simple configuration, essentially of a unidirectional nature, consisting of a pile of stratums or layers of materials having different dielectric constant values, a priori two alternate dielectric constants. This basic structure is obtained by various manufacturing methods, well known per se, such as those using depositions or adherence techniques. A lattice of channels arranged according to a periodic two-dimension distribution is then provided through the structure having a one-dimension periodicity. The channels are bored perpendicular to the main faces of the basic structure layers, while respecting a particular pattern configuration with regular, for instance square, rectangular or triangular, meshes.

These arrangements of the invention allow obtaining a periodic dielectric structure with three-dimensional photonic band gap that simultaneously offers performances that; at least match those of the complete three-dimensional structures that have just been described and that do riot suffer from their complexity and do not involve any particular manufacturing difficulty.

For this purpose, it is appropriate for the refraction index of the internal medium in the channels to be representative of a third dielectric constant, different from both constants of the respective odd-numbered and even-numbered layers of the pile. The channels can be filled with an appropriate material, in particular with organic resins to be hardened in situ.

According to a preferred embodiment of the invention, particularly well adapted for applications in antennas operating in the atmosphere, the channels however are left open and empty and consequently will finally consist of air-filled holes. There follows that the dielectric constant is equal to unity, which allows benefiting from a strong dielectric contrast with the other structure materials.

According to its main aspect, the invention consequently provides a crystalline structure of the three-dimensional photonic band gap type
that comprises a pile of alternate series of layers of distinct dielectric materials respectively showing a first and a second determined dielectric constant values, wherein said layers in each series have a constant determined thickness between parallel main faces and said pile forms a substantially rectangular parallelepipedic block, and further comprises a plurality of parallel channels provided inside said block and crossing same along a direction orthogonal to said main faces, wherein said channels are distributed according to a two-dimension network frame or lattice and have a third determined dielectric constant value, wherein said dielectric constant values and the relative geometric dimensions of said layers and said channels are selected so as to obtain said three-dimensional photonic band gap in a predetermined frequency range.

According to another aspect, the invention provides a manufacturing method for a crystalline structure of three-dimensional photonic band gap type, comprising the following steps constructing a pile made of alternate layers of distinct materials, wherein each of said materials layers substantially forms a rectangular parallelepiped of a determined thickness and said piles constitute said substantially rectangular parallelepipedal block, and said materials show said first and said second determined electric constant, and providing a plurality of channels within said block, along a direction orthogonal to the main faces of said alternate layers.

According to this invention, the desired three-dimensional photonic band gap is obtained in a predetermined frequency range by appropriately selecting the nature of the materials used and the values of the corresponding dielectric constants, the pile layer thickness, the mesh type, the channel lattice pitch, as well as the channel section and, generally, all the physical properties of the various structure components and the geometric dimensions that characterize the layers and channels.

BRIEF DESCRIPTION OF THE DRAWINGS

The invention will now be described in a more detailed manner in connection with the appended drawings in which:

FIGS. 3A and 3B schematically illustrate a side view and a partly sectioned perspective view, respectively, of the second manufacturing step of a crystal structure with three-dimensional photonic band gap of the invention;

FIG. 3C is a detailed view of a particular configuration of the structure of FIGS. 3A and 3B;

and FIG. 4 is a graph of the above menitioned photonic band gap.

DESCRIPTION OF PREFERRED EMBODIMENTS

Figure 1A:
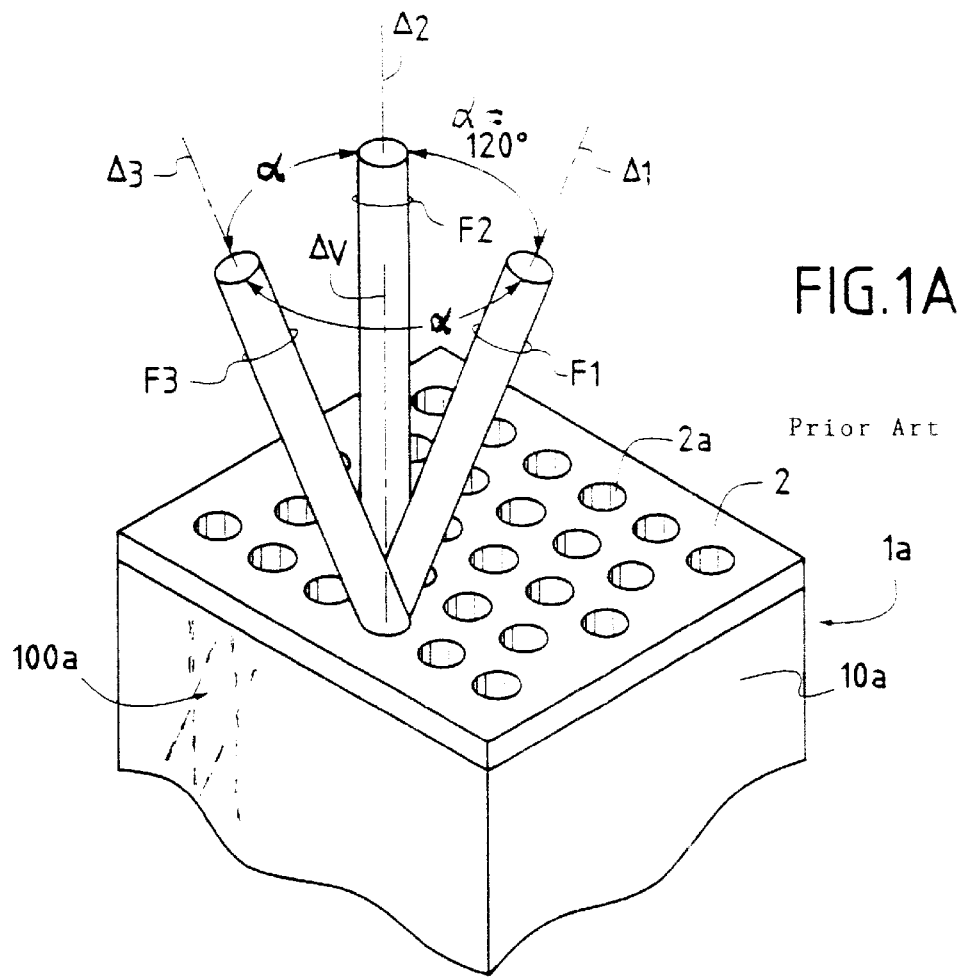
FIGS. 1A to 1C schematically illustrate three exemplary prior art crystalline structures with three-dimensional photonic band gap.
Figure 1B:
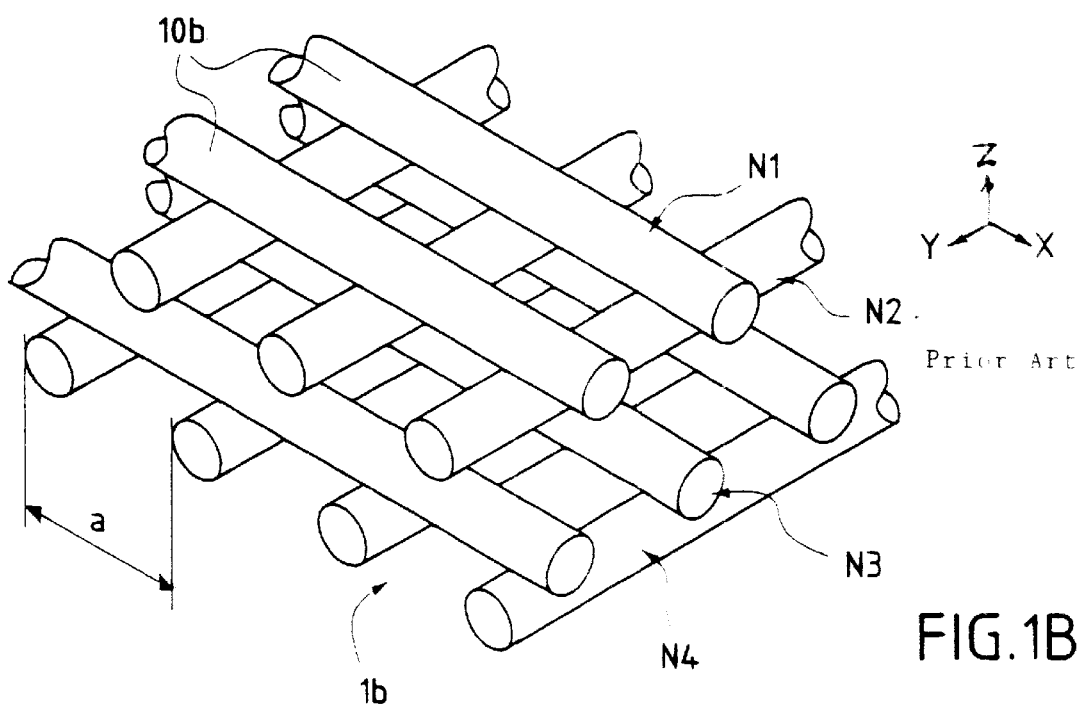
Figure 1C:
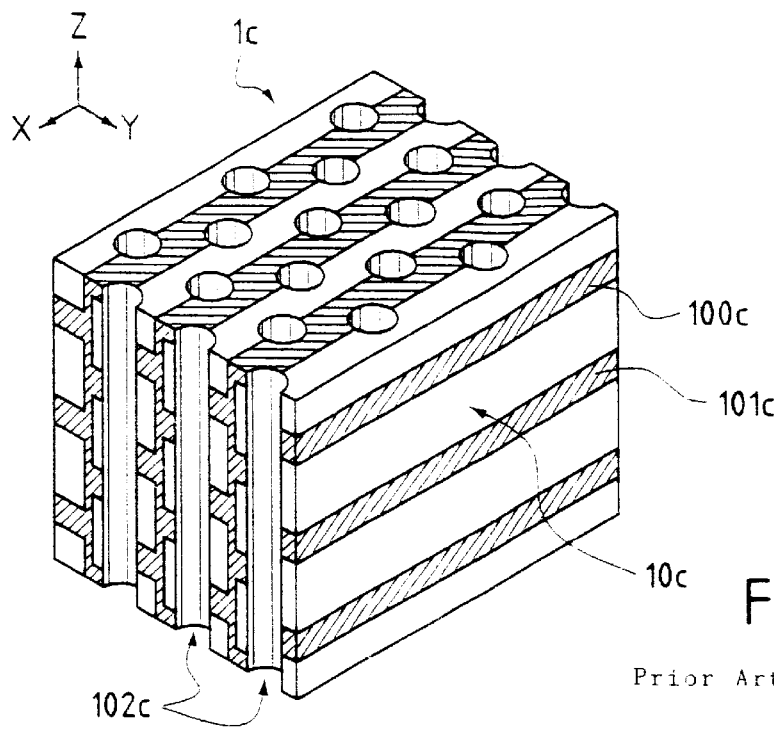
Figure 2A:
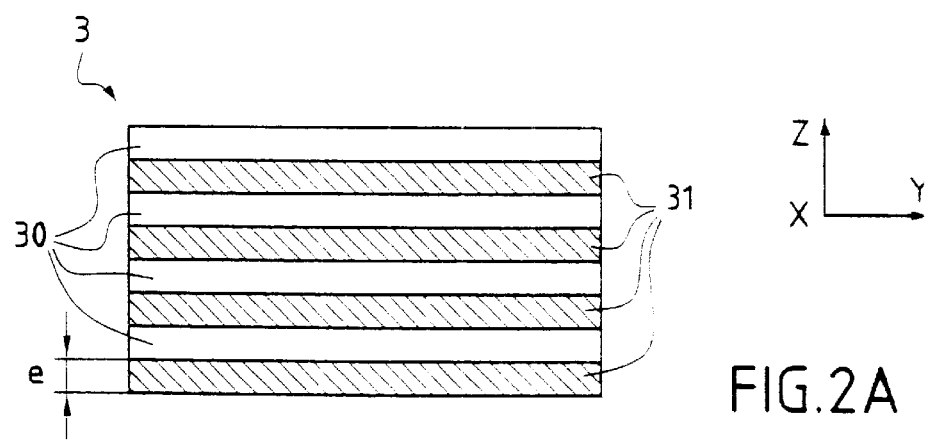
FIGS. 2A and 2B schematically illustrate a side view and a perspective view, respectively, of the first manufacturing step of a three-dimensional photonic band gap crystal according to the invention.
Figure 2B:
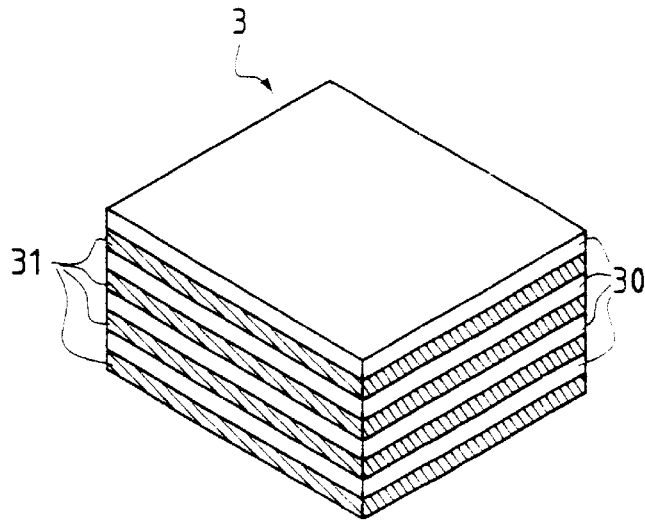

FIGS. 1A to 1C have been described already and do not require any further explanation.

An exemplary periodic crystal structure active as a three-dimensional photonic band gap, as constituted and provided according to the invention, will now be detailed with reference to FIGS. 2A to 4.

As stated above, the final three-dimensional structure is produced from a basic structure which has essentially a one-dimension configuration. This basic structure is constructed during a first step of Lie manufacturing method, more particularly illustrated in FIGS. 2A and 2B, which respectively show a side view and a perspective view of such structure.

At the end of this first step, a rectangular parallelepipedic block 3 is obtained, characterized by a periodic variation of the refractive index, and consequently of the dielectric properties, along a direction parallel to one of its dimensions. This block 3 namely consists of a pile of stratums, made of planar layers of a constant thickness and designated by 30 and 31. These layers, which all have the same thickness e, consist of distinct materials, with different dielectric constants.

More precisely, two materials with different dielectric constants are alternately used, from one layer to the next. Each of the alternate layers 30 or 31 consequently, like the complete pile, has a substantially rectangular parallelepipedic shape and all main faces arbitrarily are assumedly oriented parallel to the XY plane of the universal XYZ coordinates set.

The number of the layers in the, pile is determined depending upon the desired minimal attenuation, which is linked with the periodicity, as described in details for instance by S. Y Lin and G. Arvalingham (Tunneling of electromagnetic waves in two-dimensional photonic crystals, Optics Letters, vol 18, No. 19, Oct. 1 1993, p 1666–1668) who reported upon attenuation measurements as related to the number of layers. In preferred embodiment the pile comprises from 10 to 12 alternate layers. In the structure specifically considered in the present example, the number of layers typically corresponds to five periods, and is therefore of ten layers on top of one another in the structure.

The materials of layers 30 and 31 belonging to respectively even-numbered and odd-numbered series are selected so as to obtain a good dielectric contrast between each layer and both of its adjacent layers.

The invention remains compatible with techniques used in the field of the preferred application as considered here, namely antennas substrate production. To illustrate the present disclosure, alternate silicon and silicon dioxide $SiO_2$ layers, or else alternate gallium arsenide GaAs and gallium-aluminum arsenide of the general formula $Al_xGa_yAs$, can be selected.

Similarly, to achieve industrial production of the basis structure 3, well known manufacturing techniques, such as epitaxial growth deposition for obtaining the successive layers made of different material one after the other, or adhering separate layers together, can be resorted to. Since these methods are very largely used and mastered in the relevant field or in neighboring fields (integrated circuits production, etc.), they allow a relatively inexpensive manufacturing and a good efficiency.

During a second step, to complete the basic structure made up of block 3, a lattice of channels is provided, all of which are oriented along a direction perpendicular to the main faces of the layers 30–31 of the pile, i.e. parallel to the Z axis of the universal set XYZ.

This step will be described in conjunction with FIGS. 3A and 3B, which respectively represent a top view and a partly sectioned perspective view of the final complete structure 5, in order to better emphasize the features of the inventive structure.

These channels, designated by reference numeral 4, are represented as cylindrical holes, each of which has a circular section around a straight symmetry axis A parallel to the Z-axis (FIG. 3B). They are regularly distributed in the volume of block 3, according to a lattice having a periodically repeated mesh pattern in two directions.

Those channels 4 preferably consist of throughout holes across the block 3 which will all stay empty, so as to be filled by air, with a dielectric constant equal to unity. This arrangement causes a high dielectric contrast with the respective materials of the alternate layers in the basic periodic pile.

At the end of this step, a crystal structure 5 is obtained that constitutes the photonic crystal which will oppose a three-dimensional band gap to a transmission of a particular electromagnetic radiation, in relation with the periodic distribution of its dielectric properties in the three spatial dimensions.

Depending upon the working wavelength of the device where the structure is used (radio frequency waves, hyper frequency waves or optical waves), various technologies can be resorted to for providing the holes designed to constitute the channels 4 (with or without a specific material, like a hardening organic resin material, filling them): simple boring by drilling, photolithography, attack through active ion beams, micro-machining, etc. These techniques also are well known per se and regularly used and well mastered. The holes, advantageously, although not compulsorily, have a circular cross-section as represented in the figures and as previously indicated in relation with this type of technology.

As considered in a plane parallel to plan XY, the layout pattern of the holes or channels 4, in the lattice with its two-dimension periodic variation, can be chosen among several shapes ; square, triangular, hexagonal, etc.

FIG. 3C is an exemplary detailed figure schematically illustrating a lattice mesh with the triangular hole layout. A top view of three holes 41, 42, 43 is represented, with centers $O_1$ to $O_3$ and a single radius x. The three centers, $O_1$ to $O_3$ are arranged on the vertices of an equilateral triangle and are spaced from one another by to a pitch a, which configuration periodically is repeated in the XY plane. The holes corresponding to the two-dimension distribution channels are staggered from one row to the next, with a half pitch shift between successive adjacent rows.

Those skilled in the art will easily ascertain that the exemplarily described invention structure offers several degrees of freedom that can be used to optimize the band gap width and its two-dimension qualities, depending upon the hole or channel layout, in particular in relation with the layer pile configuration within the global block, or depending upon the materials which the basic pile layers are made of and the medium, air or other, filling the channels provided through those layers.

Those skilled in the art also will easily ascertain that the above structure is very robust by nature and that the proposed manufacturing method is very simple, The mechanical structure robustness results in particular from the fact that holes are drilled through a block of solid material, so that the vacuum coefficient is relatively low as compared to the prior art structures using piles of solid rods, even if the holes provided according to the invention remain empty and are consequently filled only with air in the practical uses of the crystal.

To clarify the present disclosure, the features of a particular exemplary embodiment corresponding to the preferred practice of the invention, as applied to antenna manufacturing for the field of the atmospheric telecommunications, will now be given.

The crystal block 3 comprises two series of alternate layers consisting of two materials with highly different refractive indices, and consequently dielectric constants. In this example, the materials are chosen so that the dielectric constants respectively equal $\in_{r1}$=11.8 and $\in_{r2}$=250 for the even-numbered and the odd-numbered layers, respectively. The dielectric contrast between adjacent layers is advantageously chosen very high in order to improve the performances of the thus obtained crystal structure. The dielectric constant for the third material is equal to unity since the material inside the holes drilled through the layers is in fact the atmospheric air.

The dimensions of block 3 are selected, in all three spatial directions, to ensure a periodically repetitive pitch meeting the working frequency requirements. The number of both even-numbered and odd-numbered layers in the Z direction, i.e. the pile height, is equal to five as previously indicated, and substantially the same number is used for the number of holes providing the channels 4, in both the length and width directions of the block. The number of holes is namely equal to 6 and to 5 alternately in each direction.

If the pitch is designated by a, the thickness of each layer is a/2. The even-numbered and the odd-numbered layers assumedly have the same thickness, but that is not compulsory. As an example, a photonic band gap around a frequency f of 500 GHz can be obtained with a pitch of 96 micrometers, since f·a/c=0.16, with a being the speed of light in vacuum.

So far as the: channels are concerned, those are distributed in such a manner as to substantially ensure the same periodicity for the variations of the dielectric constant. The pitch a for the layers is consequently also the distance between the axes of two adjacent holes. FIG. 3C exemplarily illustrates a hole layout having a hexagonal configuration, with triangular meshes. The ratio between the radius r of the cylindrical holes and the lattice pitch a (or mesh width) is equal to r/a=0.4 (see FIG. 3C). This ratio exemplarily can vary from 0.4 to 0.5. It takes into account the filling coefficient of the structure, which corresponds to the ratio between the volume occupied in the structure block by the empty channels and the total volume thereof including the remaining solid parts of the initial block.

The thus built crystal is used as an antenna support. The antenna rests on top of this crystal via a thin. transparent layer, which facilitates any arrangement and orientation modifications. It should be noted that the presence of cavities on the block edges (FIGS. 3A and 3B) substantially has no incidence, so long as the period number is large enough.

The three-dimensional photonic performances of the crystals according to the invention are of a quality substantially equal to the results obtained by the prior art techniques despite the fact that the geometry of the lattice configuration is not really homogenous in the three crystal dimensions, taking into account the differences in periodic repetition of the contrasts of dielectric-properties.

A crystal as described above was submitted to various tests. In particular, the spectrum of planar waves propagating in various directions was determined.

FIG. 4 is a graph representing the evolution of the normalized frequencies, as expressed in values of f·a/c as a function of the value (in radians) of the propagation direction vector K in the first Brillouin zone. This spectrum shows the photonic band with a value of 0.16 on the ordinate scale.

The total bandwidth is 3%. Am optimization is obtainable by adjusting the above-mentioned r/a ratio, the values of the dielectric constants, or the number of pile layers.

Upon reading the present description, those skilled in the art will easily ascertain that the invention reaches its target.

However, it should be clear that it is not, by any means, limited to the only embodiment just described, in particular, in relation with FIGS. 2A to 4.

In particular, the numeric values were only given to. is clarify the examples. They depend essentially upon the precise targeted application, in particular the working frequency of the device in which the crystal structure with a photonic band gap is used.

It should also be clear that the invention, although particularly well adapted to antenna substrate manufacturing, is not limited to this type of applications.

For other applications, it is similarly possible to use a solid material integrated in the structure to fill the holes through the pile of layers, rather than letting them be filled by the surrounding medium, in particular by atmospheric air.

What is claimed is:

1. A three-dimensional photonic band gap crystal structure, comprising:

a pile of two alternate series of respectively odd and even layers made of distinct dielectric materials respectively showing a first and a second determined dielectric constant values, said pile forming a substantially rectangular parallelepipedic block, and said layers in said series between parallel main faces of the rectangular parallelepipedic block having a constant determined thickness; and a plurality of parallel channels showing a third determined dielectric constant value provided throughout said rectangular parallelepipedic block along a direction orthogonal to said main faces and distributed therein according to a two-dimensional lattice pattern, wherein said dielectric constant values and the relative geometric dimensions of said layers in said series and said channels are selected so as to obtain a three-dimensional photonic band gap in a predetermined frequency range.

2. A crystal structure according to claim 1, wherein said channel are distributed according to a regular pattern having a triangular mesh in a plane XY parallel to said main faces.

3. A crystal structure according to claim 2, wherein said parallel channels include cylindrical holes having a uniform circular cross-section, and all of said holes have the same diameter.

4. A crystal structure according to claim 3, wherein the first and second dielectric constant values differ from one another to produce a dielectric contrast, and said cylindrical holes are filled with air.

5. A crystal structure according to claim 3, wherein said cylindrical holes are filled with air.

6. A crystal structure according to claims 4 or 5, wherein said predetermined frequency range is within at least one of a hyper-frequency range and an optical wave range.

7. A crystal structure according to claims 4 or 5, wherein a ratio between a radius r of the cylindrical holes and a lattice pitch a is from 0.4 to 0.5.

8. A crystal structure according to claim 3, wherein said pile comprises:

ten to twelve alternate layers of a same thickness; and the channels through the pile are formed of five or six cylindrical holes per row, wherein a ratio between a radius r of the cylindrical holes and a lattice pitch a is from 0.4 to 0.5.

9. A three-dimensional photonic band gap crystal structure for use as an antenna substrate of an omni-directional reflector, comprising:

a rectangular parallelepipedic block including, a pile of ten to twelve alternate layers of two different dielectric constant values, said alternate layers having an equal constant thickness between parallel main faces; and a plurality of air-filled cylindrical holes therein, said holes extending throughout said rectangular parallelepipedic block along a direction orthogonal to said parallel main faces and being distributed according to a regular two-dimensional lattice pattern of triangular pitch, wherein the number of said holes is 5 or 6 per row and a ratio between the radius of the holes and a lattice pitch is from 0.4 to 0.5.

10. A method for manufacturing a three-dimensional photonic band gap structure comprising:

constructing a rectangular parallelepipedic block including a pile of alternate layers of distinct materials showing respective first and said second determined dielectric constant values, said layers having rectangular parallelepipedic shapes of a uniform determined thickness between parallel main faces of said rectangular parallelepipedic block, said pile forming a substantially parallelepipedic block; and providing a lattice of regularly distributed channels bored throughout said rectangular parallelepipedic block along a direction orthogonal to said main faces of said alternate layers.

11. A method according to claim 10, wherein said constructing comprises:

constructing said pile of alternate layers by epitaxial growth of successive layers in the alternate layers.

12. A method according to claim 10, wherein said providing comprises:

drilling said channels to obtain holes through said pile of alternate layers.

* * * * *